(12) United States Patent
Karp

(10) Patent No.: US 11,114,429 B2
(45) Date of Patent: Sep. 7, 2021

(54) INTEGRATED CIRCUIT DEVICE WITH ELECTROSTATIC DISCHARGE (ESD) PROTECTION

(71) Applicant: Xilinx, Inc., San Jose, CA (US)

(72) Inventor: James Karp, Saratoga, CA (US)

(73) Assignee: XILINX, INC., San Jose, CA (US)

( * ) Notice: Subject to any disclaimer, the term of this patent is extended or adjusted under 35 U.S.C. 154(b) by 100 days.

(21) Appl. No.: 16/392,460

(22) Filed: Apr. 23, 2019

(65) Prior Publication Data

US 2020/0343237 A1 Oct. 29, 2020

(51) Int. Cl.
*H01L 27/02* (2006.01)
*H01L 25/065* (2006.01)
*H01L 23/60* (2006.01)
*H01L 23/31* (2006.01)

(52) U.S. Cl.
CPC ...... *H01L 27/0255* (2013.01); *H01L 23/3114* (2013.01); *H01L 23/60* (2013.01); *H01L 25/0657* (2013.01)

(58) Field of Classification Search
CPC .................................................. H01L 27/0255
See application file for complete search history.

(56) References Cited

U.S. PATENT DOCUMENTS

| 5,477,414 A | 12/1995 | Li et al. |
| 5,489,866 A | 2/1996 | Diba |
| 5,610,790 A | 3/1997 | Staab et al. |
| 5,623,387 A | 4/1997 | Li et al. |
| 5,689,133 A | 11/1997 | Li et al. |
| 5,959,821 A | 9/1999 | Voogel |
| 6,268,639 B1 | 7/2001 | Li et al. |
| 6,569,576 B1 | 5/2003 | Hsueh et al. |
| 6,645,802 B1 | 11/2003 | Li et al. |
| 6,740,936 B1 | 5/2004 | Gitlin et al. |
| 6,760,205 B1 | 7/2004 | Gaboury |
| 6,972,939 B1 | 12/2005 | Ho et al. |

(Continued)

OTHER PUBLICATIONS

U.S. Appl. No. 15/429,112, filed Feb. 9, 2017 entited: "ESD Protection in a Stacked Integrated Circuit Assembly", San Jose, CA USA.

(Continued)

*Primary Examiner* — Douglas M Menz
(74) *Attorney, Agent, or Firm* — Patterson + Sheridan, LLP

(57) ABSTRACT

Disclosed herein are integrated circuit devices and methods for fabricating the same that include at least one non-I/O die having ESD protection circuitry. The ESD protection circuitry disclosed herein may also be utilized in I/O dies. In one example, an integrated circuit device includes a die having a first body. First and second contact pads are exposed to a surface of the first body. The first contact pad is configured to connect to a first supply voltage. The second contact pad is configured to connect to a second supply voltage or ground. A first charge-sensitive circuitry formed in the first body is coupled between the first and second contact pads. A first RC clamp formed in the first body is coupled between the first and second contact pads. The first RC clamp includes at least two BigFETs coupled between the first and second contact pads, and a trigger circuitry coupled in parallel to gate terminals of the at least two BigFETs.

17 Claims, 6 Drawing Sheets

(56) References Cited

U.S. PATENT DOCUMENTS

| | | |
|---|---|---|
| 6,978,541 B1 | 12/2005 | Feltner et al. |
| 7,372,679 B1 | 5/2008 | Ho et al. |
| 7,646,063 B1 * | 1/2010 | Boyd .................. H01L 27/027 |
| | | 257/355 |
| 7,812,674 B2 | 10/2010 | Karp |
| 7,872,346 B1 | 1/2011 | Chee et al. |
| 8,134,813 B2 | 3/2012 | Karp et al. |
| 8,174,112 B1 | 5/2012 | Karp et al. |
| 8,181,140 B2 | 5/2012 | Kireev et al. |
| 8,194,372 B1 | 6/2012 | Chong et al. |
| 8,218,277 B2 | 7/2012 | Li et al. |
| 8,384,225 B2 | 2/2013 | Rahman et al. |
| 8,453,092 B2 | 5/2013 | Kireev et al. |
| 8,560,982 B2 | 10/2013 | Rahman |
| 8,618,648 B1 | 12/2013 | Kwon et al. |
| 8,717,723 B2 | 5/2014 | Kireev et al. |
| 8,742,477 B1 | 6/2014 | Banijamali |
| 8,802,454 B1 | 8/2014 | Rahman et al. |
| 8,866,229 B1 | 10/2014 | Fakhruddin et al. |
| 8,881,085 B1 | 11/2014 | Karp et al. |
| 8,947,839 B2 | 2/2015 | Karp |
| 8,982,581 B2 | 3/2015 | Karp et al. |
| 9,013,845 B1 | 4/2015 | Karp |
| 9,099,999 B1 | 8/2015 | Wang et al. |
| 9,136,690 B1 | 9/2015 | Upadhyaya et al. |
| 9,356,442 B2 | 5/2016 | Cai et al. |
| 9,406,738 B2 | 8/2016 | Kireev et al. |
| 10,297,590 B1 * | 5/2019 | Laine .................. H01L 29/7835 |
| 2009/0089719 A1 * | 4/2009 | Gauthier, Jr. ........ H01L 27/0285 |
| | | 716/100 |
| 2010/0103570 A1 * | 4/2010 | Song .................. H01L 27/0262 |
| | | 361/56 |
| 2013/0128400 A1 * | 5/2013 | Yeh .................... H01L 27/0285 |
| | | 361/56 |
| 2013/0187280 A1 | 7/2013 | Yuan et al. |
| 2014/0376134 A1 * | 12/2014 | Hunter .................. H02H 9/044 |
| | | 361/56 |
| 2016/0013636 A1 * | 1/2016 | Cai ........................ H02H 9/04 |
| | | 361/56 |
| 2018/0337170 A1 * | 11/2018 | Kanawati ................ H01L 23/66 |
| 2020/0035668 A1 * | 1/2020 | Savanth ............... H02H 1/0007 |

OTHER PUBLICATIONS

Xilinx, Inc., Karp, James, et al., White Paper, Zynq UltraScale+ MPSoCs, "Meet Automotive ESD and SEED Requirements with Zynq UltraScale+ MPSoCs", WP500 (v1.0), pp. 1-12, Feb. 13, 2018, San Jose, CA USA.

Keppens, Bart, "On-chip ESD protection for Internet of Things", SOFICS, pp. 1-10, 2016.

* cited by examiner

INTEGRATED CIRCUIT DEVICE WITH ELECTROSTATIC DISCHARGE (ESD) PROTECTION

TECHNICAL FIELD

Examples of the present disclosure generally relate to semiconductor devices and, in particular, to electrostatic discharge (ESD) protection for a non-I/O die for use in a stacked chip package, and chip packages having the same.

BACKGROUND

Electronic devices, such as tablets, computers, copiers, digital cameras, smart phones, control systems and automated teller machines, among others, often employ electronic components which leverage chip package assemblies for increased functionality and higher component density. Conventional chip packaging schemes often utilize a package substrate, often in conjunction with a through-silicon-via (TSV) interposer substrate, to enable a plurality of integrated circuit (IC) dies to be mounted to a single package substrate. The IC dies may include memory, logic or other IC devices. Some IC packages include multiple dies are stacked on each other (referred to as stacked IC assembly). In a stacked IC assembly, the die in contact with the package or interposer substrate is referred to as an input/output (I/O) die, while the die stacked on the I/O die referred to as a non-I/O die.

To prevent damage to the integrated circuits, the dies typically include circuitry for electrostatic discharge (ESD) protection. In most conventional applications, the I/O the includes ESD routing that provides a low resistive path from solder bumps on the package substrate down to active circuitry of the I/O die. Conventional ESD routing may include dual diodes and power clamps. Conventional power clamps utilize a single big field-effect transistor (often referred to as BigFET) which have large gates to enable use in high current applications. ESD protection circuits utilizing conventional BigFETs have thick gate oxide layers because thick-oxide transistors much are less sensitive to damage from high ESD voltage/current than thin-oxide transistors. Since ESD events often occur near or at the I/O die, the ability of BigFETs to quickly and efficiently handle high ESD current greatly enhances the reliability and performance of the I/O die, and consequently, the chip package.

Non-I/O dies on the other hand, generally have little or no on-board (e.g., in-die) ESD protection, and primarily rely on the ESD circuitry of the attached I/O die for ESD protection. However, the non-I/O die can experience ESD events, and total reliance upon the ESD circuitry of an attached I/O die may not be adequate in all circumstances. Non-I/O dies can employ the same dual diode/single BigFET power clamp ESD circuitry as the I/O die, but such a configuration is overkill and would unnecessarily contribute to excess cost and complexity of the non-I/O die.

Therefore, a need exists for improved ESD protection on-board a non-I/O die, and chip packages having the same.

SUMMARY

Techniques for electrostatic discharge (ESD) protection in a stacked integrated circuit (IC) packages methods for fabricating the same are described herein that include at least one non-I/O die having ESD protection circuitry. The ESD protection circuitry disclosed herein may also be utilized in I/O dies.

In one example, an integrated circuit device is provided that includes an integrated circuit (IC) die having a first body. The first body includes a passive region and an active region. First and second contact pads are exposed to a surface of the first body. The first contact pad is configured to connect to a first supply voltage. The second contact pad is configured to connect to a second supply voltage or ground. A first charge-sensitive circuitry formed in the first body is coupled between the first and second contact pads. A first RC clamp formed in the first body is also coupled between the first and second contact pads. The first RC clamp includes at least two BigFETs coupled between the first and second contact pads, and a trigger circuitry coupled in parallel to gate terminals of the at least two BigFETs.

In another example, an integrated circuit device is provided that includes a non-I/O die having an active region and an I/O die having an active region mechanically and electrically coupled to the active region of the non-I/O die. The non-I/O die includes a first body, a first charge-sensitive circuitry, and a first RC clamp. The first body includes a passive region and the active region. The first charge-sensitive circuitry is formed in the first body and is coupled between a first contact pad and a second contact pad. The first and second contact pads are exposed on a surface of the first body. The first RC clamp is formed in the first body and is coupled between the first contact pad and the second contact pad. The first RC clamp includes a first BigFET and a second BigFET serially coupled between the first contact pad and the second contact pad. The I/O die includes a second body, first and second contact pads, a second electronic device, and second RC clamp. The first contact pad is exposed to a surface of the second body, and is mechanically and electrically coupled to the first contact pad of the first body. The second contact pad is exposed to the surface of the second body, and is mechanically and electrically coupled to the second contact pad of the first body. The second electronic device is formed in the second body and is coupled between the first contact pad and the second contact pad exposed on the surface of the I/O die. The second RC clamp is formed in the second body and is coupled between the first contact pad and the second contact pad of the I/O die. The integrated circuit device also includes a substrate that is mechanically and electrically coupled to a passive region of the I/O die.

In still another example, a method for forming an integrated circuit device is provided. The method includes mounting an active region of a non-I/O die on an active region of an I/O die, the non-I/O die comprising an RC clamp having at least two BigFETs; and mounting a passive region of the I/O die on a substrate.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
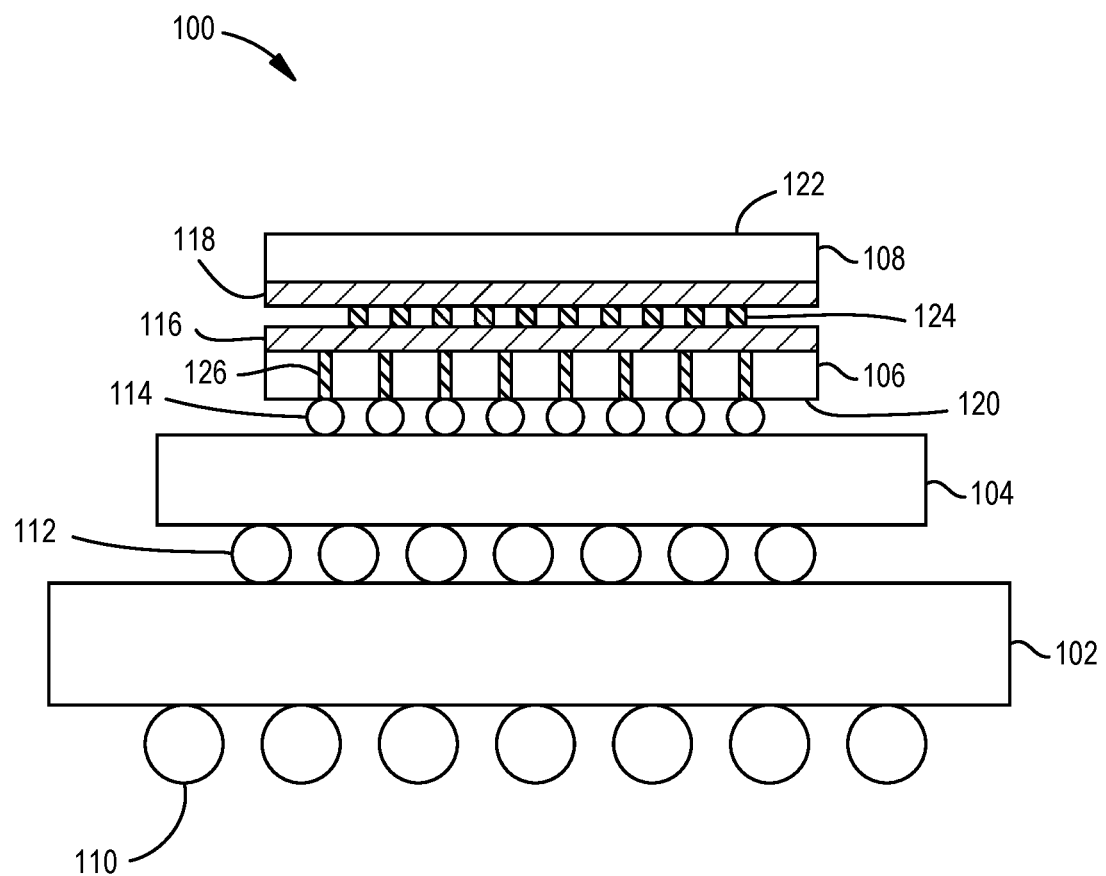
FIG. 1 is a cross-section view of a stacked IC assembly that includes a non-I/O die stacked on an I/O die, according to an example implementation.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. An aspect or an advantage described in conjunction with a particular example is not necessarily limited to that example and can be practiced in any other examples even if not so illustrated or if not so explicitly described.

Techniques for electrostatic discharge (ESD) protection in a stacked integrated circuit (IC) assembly are described herein. In examples, an integrated circuit (IC) assembly includes a substrate, and a non-I/O die stacked on an I/O die. The stacked non-I/O and I/O dies are mounted to a substrate. In the stacked IC assembly, ESD current within the non-I/O die is routed through ESD circuitry on-board the non-I/O die that includes an RC clamp having a plurality of BigFETs. The BigFETs are coupled in series to provide an efficient and cost effective RC clamp for protection of charge-sensitive circuitry within the non-I/O die without reliance of ESD circuitry of an attached I/O die as found in conventional chip packages. As further described herein, the BigFETs are arranged to provide a breakdown voltage sufficient to provide ESD protection for the charge-sensitive circuitry on-board the non-I/O die. The use of multiple BigFETs permits the optional utilization of thin gate oxide layers within the BigFETs for a more cost effective and simpler fabrication process. The ESD circuitry may also optionally utilized one or more diffusion guard rings disposed around one or more of the BigFETs comprising the ESD circuitry, which further increases the breakdown voltage and thus enhances the ability of the ESD circuitry to effectively handle significant ESD events. Although the novel ESD circuitry described below has particular utilized when utilized in a non-I/O die, the ESD circuitry may also be utilized in I/O dies to take advantage of the lower cost and simpler fabrication process as compared to traditional ESD circuitry.

FIG. 1 is a cross-section view of an integrated circuit device illustrated as stacked chip package 100, according to an exemplary implementation. The stacked chip package 100 includes substrate, a first integrated circuit (IC) die 106, and a second IC die 108. The second die 108 is stacked on the first die 106. The stacked combination of the dies 106, 108 is mounted on the substrate. Thus in the example of FIG. 1, the first die 106 is an input/output (I/O) die, while the second die 108 is a non-I/O die. In one example, the substrate may be a package substrate 102. In another example and as depicted in FIG. 1, the substrate is an interposer substrate 104 that is mounted on a package substrate 102 for form the package 100. The IC dies 106, 108 are electrically and mechanically connected to one another. The stacked combination of the dies 106, 108 is electrically and mechanically connected to the interposer substrate 104. The interposer substrate 104 is electrically and mechanically connected to the package substrate 102. The package substrate 102 can be electrically and mechanically connected to a substrate external to the chip package 100, such as a printed circuit board (PCB) not shown in FIG. 1.

The package substrate 102 can be any suitable type organic substrate, inorganic substrate, or the like. The package substrate 102 includes a plurality of solder balls 110 that provide external electrical contacts for the stacked chip package 100. The interposer substrate 104 can be any suitable type of organic substrate, inorganic substrate, or the like. The interposer substrate 104 includes a plurality of solder bumps 112 (e.g., C4 bumps). The package substrate 102 includes metallization (not shown) that electrically connects the solder balls 110 to the solder bumps 112. The IC dies 106, 108 can include a semiconductor substrate, such as silicon or the like. The first die 106 includes a plurality of solder bumps (e.g., microbumps). The interposer substrate 104 includes metallization (not shown) that electrically connects the solder bumps 112 to the solder bumps 114.

The first die 106 further includes through-silicon vias (TSVs) 126 and an active side 116. The TSVs 126 extend between a backside 120 of the first die 106 and the active side 116. The active side 116 includes active circuitry and metallization (shown in FIG. 2). The TSVs 126 electrically connect the solder bumps 114 to the active side 116. The second die 108 further includes a backside 122 and an active side 118. The active side 118 includes active circuitry and metallization (not shown). The active side 116 is electrically coupled to the active side 118 by contacts 124, such as metal pillars, solder bumps, or the like.

In the example of FIG. 1, the second die 108 is electrically and mechanically mounted to the first die 106 by the contacts 124. The first die 106 is electrically and mechanically mounted to the interposer substrate 104 by the solder bumps 114. The interposer substrate 104 is electrically and mechanically mounted to the package substrate 102 by the solder bumps 112. The package substrate 102 can be electrically and mechanically mounted to an external substrate (not shown), such as a PCB by the solder balls 110. The stacked IC assembly can optionally include various other elements which have been omitted for clarity, such as underfill, a lid, and the like.

The stacked chip package 100 can also include other variations than the example shown in FIG. 1. In the example, the IC dies 106, 108 are stacked face-to-face (e.g., active side to active side). The "active side" as used herein refers to the side of a silicon substrate on which the active devices (i.e., transistors, capacitors and the like) are fabricated, as opposed to the "backside" of the silicon substrate. In other examples, the IC dies 106, 108 can be stacked face side to backside (e.g., the active side 118 of the second die 108 can be mounted to the backside 120 of the first die 106, and the active side 116 of the first die 106 can be mounted on the interposer substrate 104). In either example, the first die 106 includes TSVs 126 to provide electrical pathways between the backside 120 and the active side 116. In another example and as mentioned above, the interposer substrate 104 can be omitted and the stacked combination of the first die 106 and the second die 108 can be mounted directly to the package substrate 102. In the example shown, the stacked chip package 100 includes two IC dies 106 and 108. However, the stacked chip package 100 can include more than two IC dies. For example, three or more IC dies can be mounted to form a single die stack. In another example, multiple stacks of IC dies can be mounted on the interposer substrate 104 in a side-by-side arrangement.

Electrical charge can build up at various interfaces between the substrates in the stacked chip package 100. For example, charge can accumulate on the solder balls 110, at the semiconductor substrate of the second die 108, and at the internal nodes of the circuitry of the IC dies 106, 108. Such charges can discharge through the circuitry of the IC dies 106, 108 (referred to as electrostatic discharge (ESD)). Thus, the IC dies 106, 108 can include ESD protection circuitry therein to protect charge-sensitive circuitry from ESD.

In one example, the first die 106 includes ESD protection circuitry formed on the active side 116. The source of the charge and/or the electrical ground can be through TSVs 126 of the first die 106. Thus, the first die 106 includes "U-routes" in the metallization on the active side 116 to electrically connect given TSVs 126 to active circuitry formed in the semiconductor substrate. These U-routes are described further below with respect to FIG. 2.

Figure 2:
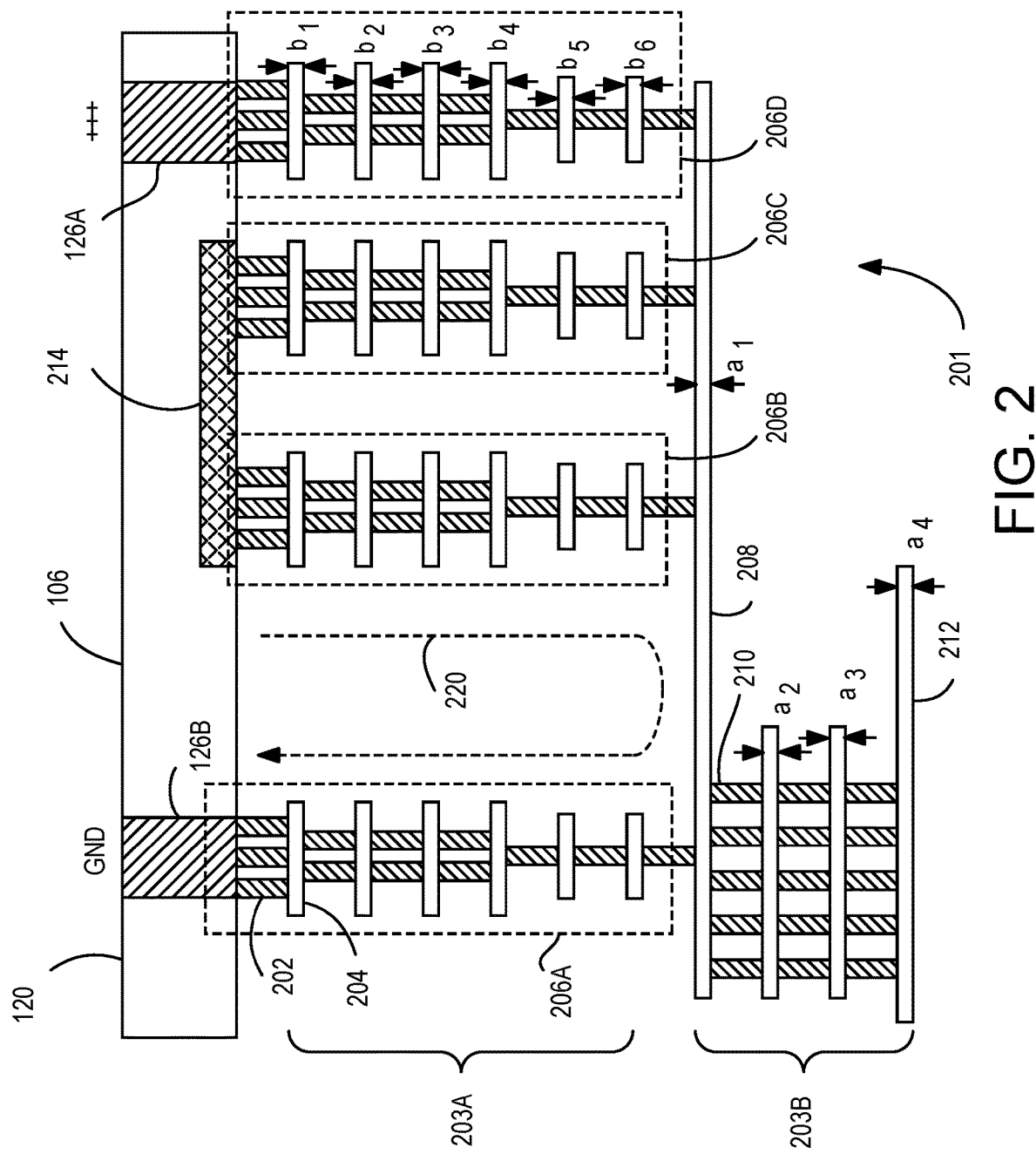
FIG. 2 is a cross-section showing the I/O die in more detail, according to an example.

FIG. 2 is a cross-section showing the first die 106 in more detail according to an example. In the example of FIG. 2, the first die 106 is rotated 180 degrees such that the backside 120 is at the top of FIG. 2 and the active side 116 is at the bottom of FIG. 2. In the example, the first die 106 includes TSVs 126A and 126B. The TSV 126A is electrically coupled to a positive source of charge (e.g., a solder ball on the package). The TSV 126B is electrically coupled to an electrical ground (e.g., another solder ball on the package). The first die 106 includes ESD circuitry 214 formed in the semiconductor substrate (e.g., transistors, diodes, capacitors, etc.). The first die 106 further includes metallization 201 formed on the active side 116 thereof. In general, the metallization 201 includes a first plurality of metal layers 203A and a second plurality of metal layers 203B. The first plurality of metal layers 203A is formed on the semiconductor substrate and is nearest the semiconductor substrate. The second plurality of metal layers 203B are formed on the first plurality of metal layers 203A and are farthest from the semiconductor substrate. In general, the metallization 201 can include any number of metal layers, and each plurality 203A and 203B can each include any number of metal layers. Further, in general, metal layers nearest the substrate of the first die 106 are thinner than metal layers farther from the substrate of the first die 106. Thus, the metal layers in the plurality of metal layers 203A are thinner than the metal layers in the plurality of metal layers 203B. The metallization 201 also includes dielectric material layers disposed between the metal layers, which is omitted for clarity.

In the example, the metallization 201 includes towers 206A, 206B, 206C, and 206D (generally towers 206). Each tower 206 is formed in the plurality of metal layers 203A (e.g., the thinner metal layers). Each tower 206 includes a vertical stack of vias 202 and metal segments 204. In the example, the tower 206D is electrically coupled to the TSV 126A. The tower 206A is electrically coupled to the TSV 126B. The towers 206B and 206C are electrically connected to the ESD circuitry 214.

In the example, the metallization 201 includes metal segments 208 and vias 210 formed in the plurality of metal layers 203B. The metal segments 208 are thicker than the metal segments 204 formed in the plurality of metal layers 203A. A metal segment 212 is the metal layer farthest from the substrate of the second die 108 and is formed in the plurality of metal layers 203B. In the example, each of the towers 206 is electrically coupled to a metal segment 208 in the plurality of metal layers 203B.

In the example, the source and sink of current for an ESD discharge path are the TSVs 126A and 126B, respectively. Further, ESD protection circuitry (an example shown in FIG. 3) is formed in the ESD circuitry 214. To protect charge-sensitive circuitry against ESD, the ESD discharge path must include the ESD protection circuitry in the ESD circuitry 214. Thus, the metallization 201 includes U-routes for electrically connecting the TSVs 126A, 126B to the ESD circuitry 214. In general, a U-route includes two vertical conductive paths (perpendicular to the second die 108) and a horizontal conductive path (parallel with the second die 108). One type of U-route includes a horizontal conductive path formed in the plurality of metal layers 203A (e.g., using the metal layer nearest the substrate of the second die 108). While such a U-route is the shortest path, the horizontal conductive path is formed using thin metal segment(s), which can be damaged by the current of an ESD discharge. Thus, use of metal segments 204 for the horizontal conductive path of a U-route should be avoided. In the example, a U-route includes a horizontal conductive path formed using metal layer(s) of the plurality of metal layers 203B (e.g., thicker metal layers). Thus, the U-route includes two towers 206 for the vertical conductive paths and metal segments 208 for the horizontal conductive path. For example, a U-route 220 includes the tower 206B for one vertical conductive path, the metal segments 208 for the horizontal conductive path, and the tower 206A for the other vertical conductive path. Metal segment(s) 208 are further electrically coupled to the ESD circuitry 214 through the towers 206B and 206C. Another U-route (not explicitly shown) is formed by the tower 206D, metal segment(s) 208, and the tower 206C. The U-routes electrically connect the TSVs 126A, 126B to the ESD circuitry 214 and employ horizontal conductive paths that use the thicker metal segments, rather than thinner metal segments of the plurality of metal layers 203A. U-routes are used to avoid damage to the ESD discharge path that might otherwise occur if the ESD discharge path was routed directly from the ESD element to a TSV.

Figure 3:
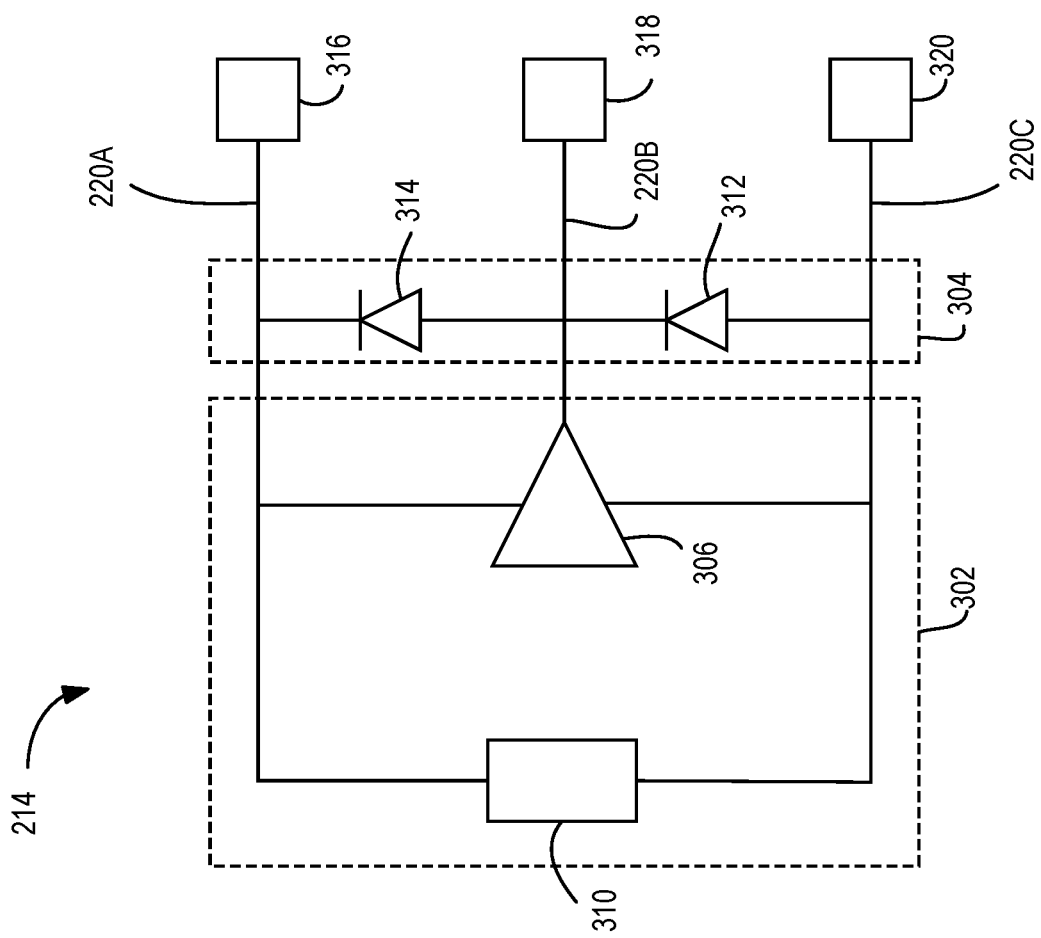
FIG. 3 is a schematic diagram depicting circuitry of the I/O die, according to an example.

FIG. 3 is a schematic diagram depicting the circuitry 214 according to an example. The circuitry 214 includes a circuit 302 and ESD protection circuitry 304. The circuit 302 includes charge-sensitive circuitry 306 (e.g., a driver) and may include other ESD protection circuitry 310, such as an RC clamp. The RC clamp of other ESD protection circuitry 310 generally includes a single BigFET coupled between the U-routes 220A and 220C. The single BigFET generally includes a thick oxide gate layer. The actual thickness of the oxide gate layer is generally dependent on the technology node of the circuit design. The ESD protection circuitry 304 includes a pair of diodes 312, 314. The circuitry 214 is coupled to TSVs 316, 318, and 320 using U-routes 220A, 220B, and 220C, respectively. An anode of the diode 314 is coupled to the TSV 328 through the U-route 220B. A cathode of the diode 314 is coupled to the TSV 316 through the U-route 220A. An anode of the diode 312 is coupled to the TSV 320 through the U-route 220C. A cathode of the diode 312 is coupled to the TSV 318 through the U-route 220B. The charge-sensitive circuitry 306 is electrically coupled to each of the TSVs 316, 318, and 320. For example, the TSVs 316 and 320 may be voltage sources (e.g., VDD and VSS, respectively), and the TSV 318 may be a signal source. The circuitry 214 shown in FIG. 3 is merely exemplary. Various types of ESD protection circuitry can be employed that protect various types of charge-sensitive circuitry. The TSVs can be coupled to the circuitry 214 using any number of U-routes, as shown in FIG. 2.

Figure 4:
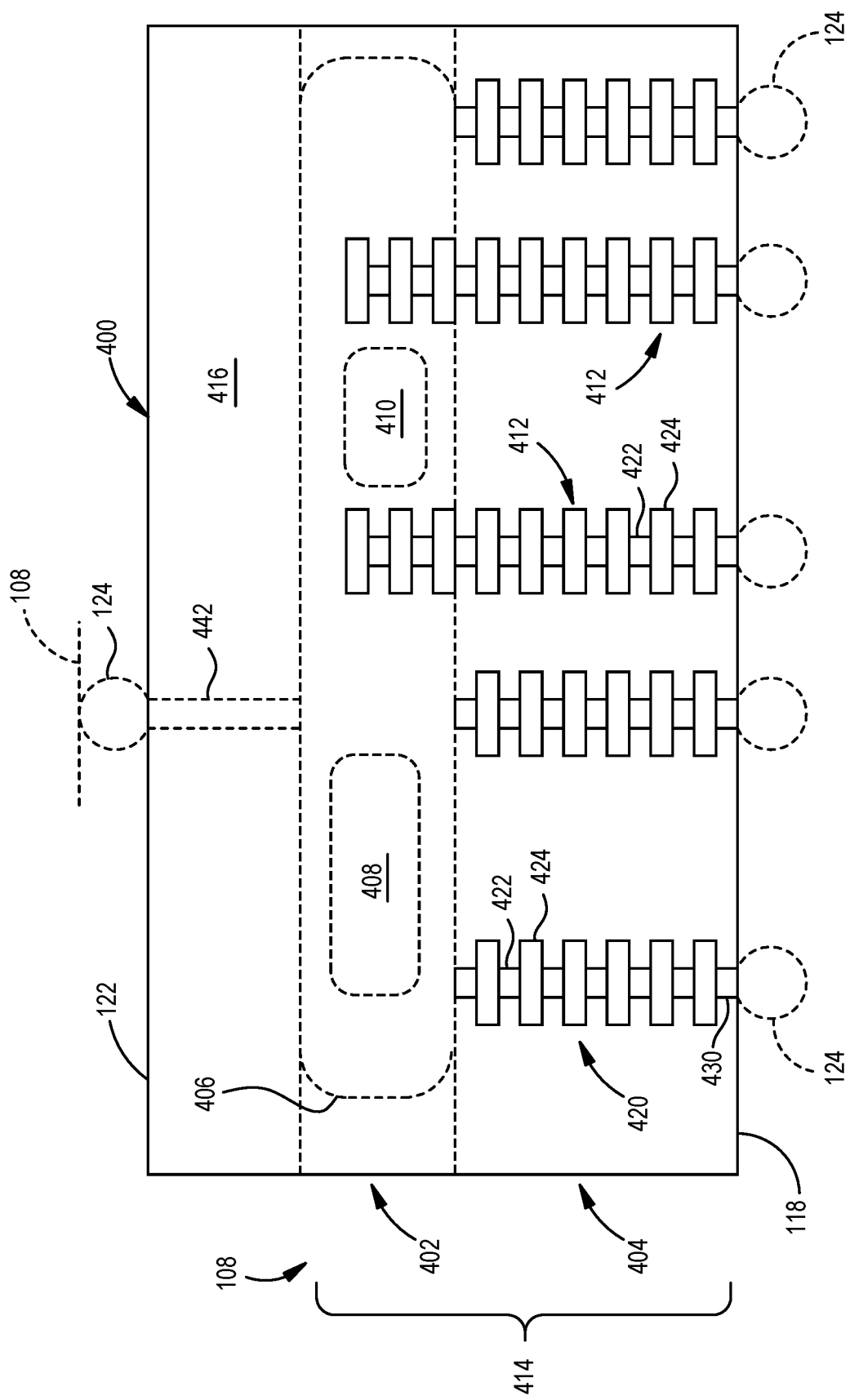
FIG. 4 is a cross-section showing the non-I/O die of FIG. 1 in more detail, according to an example.

FIG. 4 is a cross-section showing the second die 108 in more detail. In the example of FIG. 4, the backside 122 of the second die 108 is at the top of FIG. 4, while active side 118 is at the bottom of FIG. 4. Contacts 124 are shown in phantom at the active side 118 of the second die 108 for coupling to the first die 106 as illustrated in FIG. 1.

Continuing to refer to FIG. 4, the second die 108 includes a die body 400. The die body 400 is comprised of a silicon substrate 416 on which build-up layers 414 formed on the active side 118 of the substrate 416. The build-up layers 414 generally include layers of conductive and dielectric materials stacked during operations performed in the back end of the line (BEOL) and the front end of the line (FEOL) of a semiconductor fabrication plant, also known as a FAB. Thus, the layers of conductive and dielectric materials stacked during operations performed in the BEOL can be referred to as BEOL layers 404, while the layers of conductive and dielectric materials stacked during operations performed in the FEOL can be referred to as FEOL layers 402. Generally, the layers of the BEOL layers 404 are used to form interconnect circuitry 420 formed by conductive vias 422 and segments 424, terminating at contact pads 430 formed on the active side 118 of the second die 108. Thus, the BEOL layers 404 can also be referred to as the passive region of the die body 400. The contact pads 430 form a connection surface for interconnection of the second die 108 and the first die 106 through the contacts 124 (shown in phantom in FIG. 4). The BEOL layers 404 are typically thicker than the layers of the FEOL layers 402. The FEOL layers 402 are utilized to form circuitry 406 within the second die 108. The circuitry 406 generally include active circuit elements, such as transistors and the like, and as such, the FEOL layers 402 can also be referred to as the active region of the die body 400. The circuitry 406 within the second die 108 is coupled by the interconnect circuitry 420 to the first die 106 via the contacts 124.

Optionally, a second die 108 (partially shown in phantom in FIG. 4) may be stacked on the second die 108. The second die 108 disposed between the first die 106 and the second die 108 includes TSVs 442 or other routing that couple the second die 108 shown in phantom to the circuitry 406 of the second die 108 or directly to the circuitry of the first die 106.

Continuing to refer to FIG. 4, the circuitry 406 of the second die 108 generally includes ESD circuitry 410 and charge-sensitive circuitry 408 (e.g., a driver, memory, or other active circuit devices). Although the ESD circuitry 410 finds particular utility when utilized in a non-I/O die (i.e., the second die 108), the ESD circuitry 410 may optionally be utilized in an I/O die (i.e., the first die 106). The ESD circuitry 410 may optionally be protected by one or more diffusion guard rings 412. The diffusion guard ring 412 is formed from stacked segments 424 and vias 422, and provide a conductive physical barrier between the ESD circuitry 410 and the other circuitry comprising the circuitry 406 of the second die 108. The diffusion guard ring 412 may be electrically floating, or be coupled to an electrical ground or power source through the contacts 124. In examples wherein the substrate 416 of the non-I/O die is P-doped, the diffusion guard ring 412 may be coupled to a contact pad 430 that is configured to connect the diffusion guard ring 412 through the contact 124 to ground. In examples wherein the substrate 416 of the non-I/O die is N-doped, the diffusion guard ring 412 may be coupled to a contact pad 430 that is configured to connect the diffusion guard ring 412 through the contact 124 to a power source, such as Vdd and the like.

Figure 5:
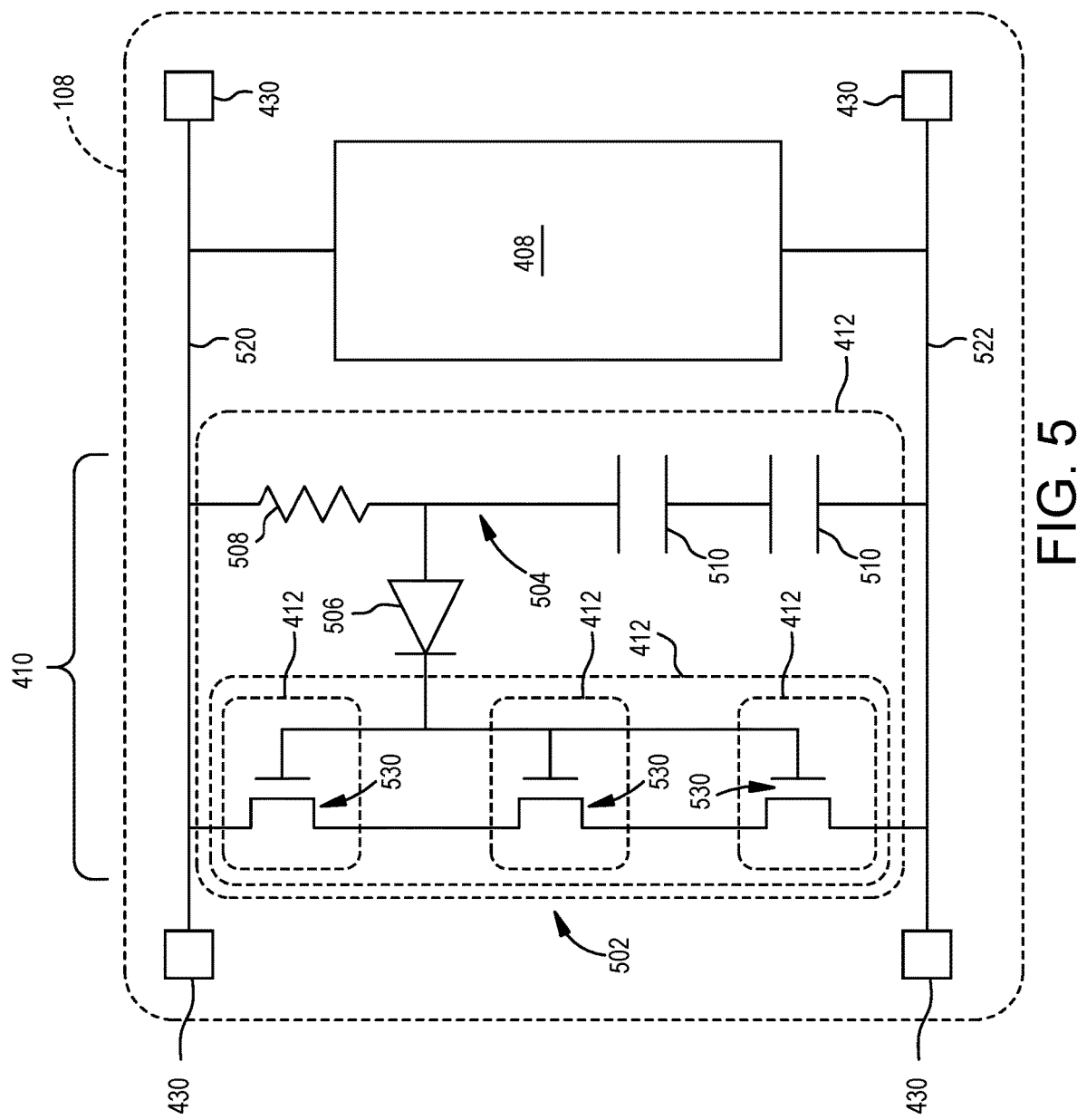
FIG. 5 is a schematic diagram depicting circuitry of the non-I/O die, according to an example.

FIG. 5 is a schematic diagram depicting the ESD circuitry 410, according to an example. The ESD circuitry 410 is coupled in parallel with the charge-sensitive circuitry 408 of the second die 108 between a first rail 520 and a second rail 522. The first rail 520 is coupled to one or more contact pads 430 that are configured to connect to power sources, such as Vdd and the like. The second rail 522 is coupled to one or more contact pads 430 that are configured to connect to ground.

The ESD circuitry 410 includes an RC clamp 502 and a trigger circuitry 504. The ESD circuitry 410 is utilized to protect the charge-sensitive circuitry 408 of the second die 108. The diffusion guard ring 412 generally functions to increase the amount of current that may be effectively handled by the ESD circuitry 410, or in otherwords, increase the breakdown voltage of the ESD circuitry 410. The diffusion guard ring 412 may be formed around the entire ESD circuitry 410, or one or more portions of the ESD circuitry 410. For example, one diffusion guard ring 412 may separate the RC clamp 502 from the trigger circuitry 504. The diffusion guard ring 412 may circumscribe one or both of the RC clamp 502 and the trigger circuitry 504. One or more diffusion guard rings 412 may circumscribe one portion, multiple portions or separate portions of the RC clamp 502. The diffusion guard ring 412 advantageously increases the break down voltage of the RC clamp 502, enabling the RC clamp 502 to handle higher currents during ESD events.

The trigger circuitry 504 provides an activation signal to the RC clamp 502, which functions as an RC clamp. The trigger circuitry 504 includes a resistor 508, an inverter 506 and at least one capacitor 510. The resistor 508 is coupled between the first rail 520 and an input of the inverter 506. The at least one capacitor 510 is coupled between the second rail 522 and the input of the inverter 506. The output of the inverter 506 is coupled to the RC clamp 502. The resistance and capacitance values for the resistor 508 and the capacitor 510, along with an amount of amplification of the inverter 506, may be selected based on the activation signals needs of the RC clamp 502 and the anticipated voltages of the ESD event. In the example depicted in FIG. 5, at least two capacitors 510 are coupled in series between the second rail 522 and the input of the inverter 506. Utilizing two or more die two or more (i.e., a plurality of) series coupled capacitors 510 improves the breakdown voltage of the trigger circuitry 504, enabling the capacitors 510 to be fabricated from thinner layers of material, such as from one or more of the FEOL layers 402, which improves device performance while reducing cost.

The RC clamp 502 includes a plurality of big field-effect transistors (BigFETs) 530 having emitter and source terminals coupled in series between the first rail 520 and the second rail 522. The gate terminals of each of the BigFETs 530 are coupled to the output of the inverter 506. In one example, the RC clamp 502 includes at least two cascoded BigFETs 530. In the example depicted in FIG. 5, three BigFETs 530 are coupled in series. In other examples, more than three BigFETs 530 are coupled in series. By coupling the BigFETs 530 in series between the first rail 520 and the second rail 522, a breakdown voltage of the RC clamp 502 significantly exceeds a breakdown voltage of an RC clamp comprising a single BigFET. For example, cascoded Big-FETs 530 have about twice the breakdown voltage of a conventional RC clamp comprising a single BigFET.

The breakdown voltage, and thus the performance of the RC clamp 502, may be further increased by use of one or more diffusion guard rings 412. For example, one diffusion guard ring 412 may circumscribe one or more of the BigFETs 530. In another example, single diffusion guard ring 412 circumscribe each BigFETs 530. In yet another example, a first diffusion guard ring 412 may circumscribe a second diffusion guard ring 412, the second diffusion guard ring 412 circumscribing at least one or more BigFETs 530. Beneficially, a BigFET 530 circumscribed by a diffusion guard ring 412 has about twice the breakdown voltage of an unguarded BigFET 530, while a BigFET 530 circumscribed by two diffusion guard rings 412 has about three times the breakdown voltage of an unguarded BigFET 530. Thus, guarding the BigFETs 530 with one or more diffusion guard rings 412 provides significant improvement to the current capacity of the RC clamp 502.

As the series coupled BigFETs 530 have a breakdown voltage, each BigFET 530 may be fabricated utilizing thinner gate oxide layers as compared to a single BigFET utilized in a conventional RC clamp (for example as utilized in the first die 106). For example, the gate oxide layer in the single BigFET utilized in the conventional RC clamp of the other ESD circuitry 310 of the first die 106 is at least 2 to 3 times thicker than the thin gate oxide layer of the BigFET 530. Utilizing a thin gate oxide layer in the BigFET 530 allows the BigFET 530 to advantageously have a smaller form factor, and to be fabricated utilizing FEOL fabrication techniques in the FEOL layers 402. Thus, the thin gate oxide layer in the BigFET 530 is one of the FEOL layers 402. Fabricating the thin gate oxide layer of the BigFET 530 in the FEOL layer 402 is more cost effective than conventional thick oxide BigFET designs, and thus, advantageously reduces the cost and complexity of the non-I/O die. Further, as the ESD circuitry 410 effectively utilizes BigFETs 530 coupled in series to handle ESD events, dual diodes commonly utilized in ESD circuits of I/O dies are not required, which further reduces the cost and complexity of a non-I/O die relative to an I/O die, or other conventional non-I/O dies which had ESD circuits essentially identical to that of the I/O die.

In an example of the operation of the ESD circuitry 410, an ESD event may impart a charge on the first rail 520. The voltage on the first rail 520 causes current to flow to through the resistor 508 of the trigger circuitry 504 and charge the capacitor 510. A portion of the current exiting the resistor 508 provided as an input to the inverter 506. The inverter 506, in response to the input current, provides an output signal. The output signal of the inverter 506 is provided as an input signal to the gate terminals of the BigFETs 530. In response to the input signal exceeding activation voltage of the BigFETs 530, the BigFETs 530 activate to couple the first rail 520 to the second rail 522, thus allowing current on the first rail 502 to be discharged to ground through the second rail 522 while beneficially bypassing and thus protecting the charge-sensitive circuitry 408.

Because the ESD circuitry 410 is on-board (i.e., within the die body) of the second die 108, the charge-sensitive circuitry 408 of the second die 108 is protected from ESD events prior to coupling to the first die 106. For example, the second die 108 having on-board ESD circuitry 410 is protected from ESD events during fabrication, sorting, testing and handling of the second die 108 prior to coupling to the first die 106. Furthermore, even after the second die 108 is coupled to the first die 106, the second die 108 from ESD events that by-pass the ESD circuitry of the connected first die 106. For example, the charge-sensitive circuitry 408 of the second die 108 is protect from ESD events propogating to the second die 108 through TVS's passing through the first die 106 that are electrically isolated from the ESD circuitry of the first die 106.

Figure 6:
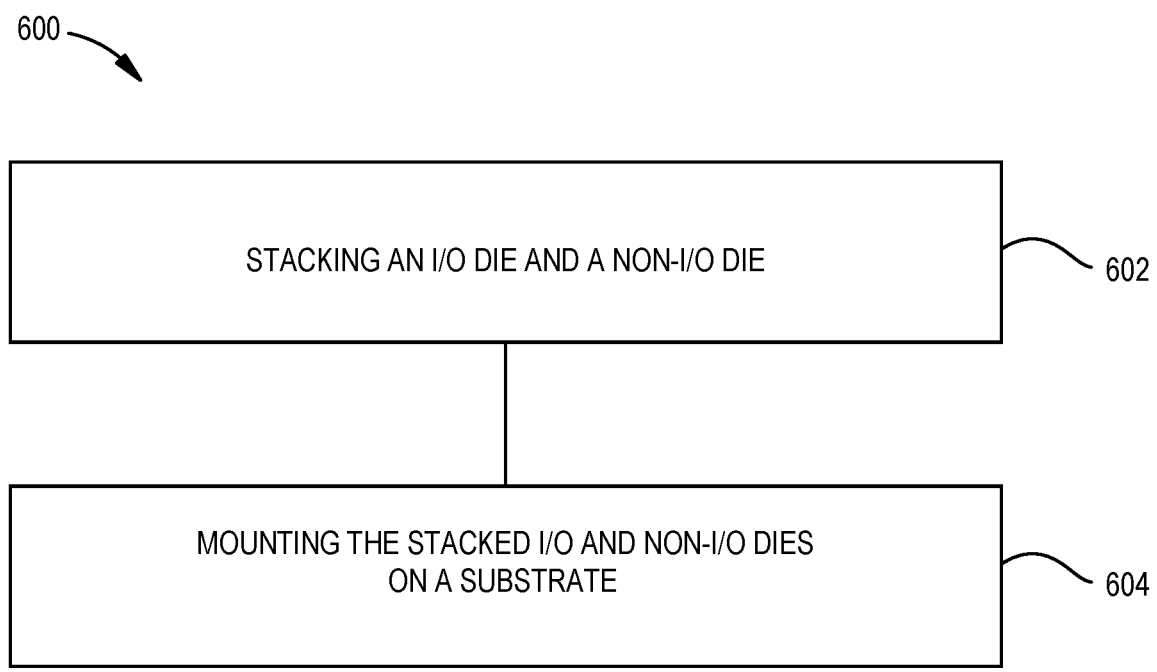
FIG. 6 is a flow diagram depicting a method of manufacturing a stacked IC assembly, according to an example.

FIG. 6 is a flow diagram depicting a method 600 for manufacturing an integrated circuit device, such as the chip package 100 described above, according to an example. The method 600 begins at can be performed by one or more semiconductor manufacturing tools. At operation 602, an O/I die and a non-I/O die are stacked. For example, the non-O/I die may be stacked on the non-I/O die. The circuitry of the O/I die is electrically and mechanically connected to the circuitry of the non-I/O die via solder interconnects. During stacking, the ESD circuitry of non-I/O die protects the charge-sensitive circuitry of the non-I/O die. Although in the example provided above the I/O and non-I/O dies are stacked active side to active side, the dies may alternatively be stacked active side to backside, or even backside to backside.

At operation 604, the stacked I/O and non-I/O dies are electrically and mechanically connected to a substrate. The substrate may be an interposer substrate or a package substrate. For example, the stacked I/O and non-I/O dies may have the I/O die directly mounted to the package substrate. When the stacked I/O and non-I/O dies are mounted to an interposer substrate (with the I/O die directly mounted to the interposer substrate) to form a stacked assembly, the interposer substrate of the stacked assembly is then electrically and mechanically connected to the package substrate.

Thus, techniques for electrostatic discharge (ESD) protection in a stacked integrated circuit (IC) assembly have been described that utilize ESD protection circuitry in a non-I/O die. In a stacked IC assembly, ESD current within the non-I/O die is routed through an RC clamp comprising a plurality of BigFETs that comprises the ESD protection circuitry. The BigFETs are coupled in series to provide an efficient and cost effective RC clamp that protects charge-sensitive circuitry within the non-I/O die without reliance of ESD circuitry of an attached I/O die as found in conventional chip packages.

While the foregoing is directed to specific examples, other and further examples may be devised without departing from the basic scope thereof, and the scope thereof is determined by the claims that follow.

What is claimed is:

1. An integrated circuit device comprising:
   a first die having a first body, the first body comprising a passive region and an active region;
   a first contact pad exposed to a surface of the first body, the first contact pad configured to connect to a first supply voltage;
   a second contact pad exposed to the surface of the first body, the second contact pad configured to connect to a second supply voltage or ground;
   a first charge-sensitive circuitry formed in the first body and coupled between the first contact pad and the second contact pad;
   a first RC clamp formed in the first body and coupled between the first contact pad and the second contact pad, the first RC clamp comprising:
      at least two BigFETs coupled between the first contact pad and the second contact pad; and
      a trigger circuitry coupled in parallel to gate terminals of the at least two BigFETs;

a plurality of FEOL layers including an oxide layer, the oxide layer forming a gate oxide layer of a first BigFET of the at least two BigFETs; and a second die having another BigFET in an RC clamp, the another BigFET of the RC clamp of the second die having an oxide gate layer thicker than the gate oxide layer of the first BigFET of the first die.

2. The integrated circuit device of claim 1, wherein the oxide gate layer of the second die is at least twice as thick than the gate oxide layer of the first BigFET of the first die.

3. The integrated circuit device of claim 1 further comprising:

a diffusion guard ring separating a first BigFET of at least two BigFETs from a second BigFET of at least two BigFETs.

4. The integrated circuit device of claim 3, wherein the diffusion guard ring separating a first BigFET forms a portion of a guard ring encircling the first BigFET.

5. The integrated circuit device of claim 1 further comprising:

a second die having a second body, the second body comprising a passive region and an active region, the active region of the second body coupled to the active region of the first body;

a first contact pad exposed to a surface of the second body, and mechanically and electrically coupled to the first contact pad of the first body;

a second contact pad exposed to the surface of the second body, and mechanically and electrically coupled to the second contact pad of the first body;

a second charge-sensitive circuitry formed in the second body and coupled between the first contact pad and the second contact pad exposed on the surface of the second die; and a second RC clamp formed in the second body and coupled between the first contact pad and the second contact pad of the second die.

6. The integrated circuit device of claim 5, the second RC clamp comprises:

a single BigFET.

7. The integrated circuit device of claim 6, wherein a gate oxide layer of the single BigFET of the second RC clamp is thicker than a gate oxide layer of the first RC clamp.

8. The integrated circuit device of claim 6 further comprising:

a substrate upon which the second die is mounted, the second die having vias coupling circuitry of the substrate to the first and second contact pads of the first die through vias formed through the second die.

9. An integrated circuit device comprising:

a first non-I/O die having an active region, the first non-I/O die comprising:

a first body, the first body comprising a passive region and an active region;

a first charge-sensitive circuitry formed in the first body and coupled between a first contact pad and a second contact pad, the first and second contact pads exposed on a surface of the first body; and a first RC clamp formed in the first body and coupled between the first contact pad and the second contact pad, the first RC clamp including a first BigFET and a second BigFET serially coupled between the first contact pad and the second contact pad;

an I/O die having an active region mechanically and electrically coupled to the active region of the first non-I/O die, the I/O die comprising:

a second body;

a first contact pad exposed to a surface of the second body, and mechanically and electrically coupled to the first contact pad of the first body;

a second contact pad exposed to the surface of the second body, and mechanically and electrically coupled to the second contact pad of the first body;

a second electronic device formed in the second body and coupled between the first contact pad and the second contact pad exposed on the surface of the I/O die; and a second RC clamp formed in the second body and coupled between the first contact pad and the second contact pad of the I/O die; and a substrate mechanically and electrically coupled to a passive region of the I/O die;

a plurality of FEOL layers including an oxide layer, the oxide layer forming a gate oxide layer of the first BigFET; and a second die having another BigFET in an RC clamp, the another BigFET of the RC clamp of the second die having an oxide gate layer thicker than the gate oxide layer of the first BigFET of the first die.

10. The integrated circuit device of claim 9, wherein the first non-I/O die further comprises:

a diffusion guard ring separating the first BigFET from the second BigFET.

11. The integrated circuit device of claim 9, wherein the first non-I/O die further comprises:

a first diffusion guard ring encircling the first BigFET.

12. The integrated circuit device of claim 11, wherein the first non-I/O die further comprises:

a second diffusion guard ring encircling the first diffusion guard ring.

13. The integrated circuit device of claim 12, wherein a gate oxide layer of the second RC clamp is thicker than a gate oxide layer of the first RC clamp.

14. The integrated circuit device of claim 9, wherein a gate oxide layer of the second RC clamp is thicker than a gate oxide layer of the first RC clamp.

15. The integrated circuit device of claim 9 further comprising:

a second non-I/O die stacked on the first non-I/O die, the second non-I/O die comprising a third RC clamp having a plurality of serially connected BigFETs.

16. The integrated circuit device of claim 15, wherein the first I/O die comprises:

vias coupling circuitry of the substrate to the second non-I/O die through the I/O die.

17. The integrated circuit device of claim 15, wherein the substrate further comprises:

a plurality of serially coupled capacitors electrically coupled between the first contact pad and the second contact pad.

* * * * *